United States Patent
Fukumoto et al.

(10) Patent No.: US 11,463,003 B2
(45) Date of Patent: Oct. 4, 2022

(54) POWER SUPPLY CONTROL DEVICE TO DISCHARGE AN OUTPUT VOLTAGE AT A TIME OF ENABLE INSTANTANEOUS INTERRUPTION

(71) Applicant: ROHM Co., LTD., Kyoto (JP)

(72) Inventors: Yosuke Fukumoto, Kyoto (JP); Shun Fukushima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 86 days.

(21) Appl. No.: 16/922,144

(22) Filed: Jul. 7, 2020

(65) Prior Publication Data

US 2021/0013804 A1 Jan. 14, 2021

(30) Foreign Application Priority Data

Jul. 8, 2019 (JP) .............................. JP2019-127025

(51) Int. Cl.
*H02M 3/158* (2006.01)
*H03K 5/24* (2006.01)
*G01R 19/165* (2006.01)
*H02M 1/00* (2006.01)

(52) U.S. Cl.
CPC ...... *H02M 3/158* (2013.01); *G01R 19/16538* (2013.01); *H03K 5/24* (2013.01); *H02M 1/0025* (2021.05)

(58) Field of Classification Search
None
See application file for complete search history.

(56) References Cited

U.S. PATENT DOCUMENTS

| | | | | |
|---|---|---|---|---|
| 6,201,375 B1* | 3/2001 | Larson | .................... | G05F 1/573 |
| | | | | 323/277 |
| 6,377,033 B2* | 4/2002 | Hsu | ........................ | G05F 1/618 |
| | | | | 323/274 |
| 7,221,213 B2* | 5/2007 | Lee | ......................... | G05F 1/571 |
| | | | | 323/280 |
| 8,072,198 B2* | 12/2011 | Imura | ...................... | G05F 1/56 |
| | | | | 323/276 |
| 9,753,476 B1* | 9/2017 | Shukla | .................... | G05F 1/575 |

FOREIGN PATENT DOCUMENTS

JP 2001202141 A 7/2001

\* cited by examiner

*Primary Examiner* — Jeffrey A Gblende
(74) *Attorney, Agent, or Firm* — Chip Law Group

(57) ABSTRACT

Disclosed are a power supply control device and an electronic apparatus. The power supply control device includes a power supply unit configured to generate an output voltage from an input voltage, and an output discharge unit configured to start to discharge the output voltage when an instruction to disable the power supply unit is given, and continue discharging the output voltage until the output voltage falls below a predetermined threshold voltage or until a predetermined delay time passes while the output voltage does not fall below the threshold voltage even when an instruction to enable the power supply unit is given. The electronic apparatus includes a power supply device including the power supply control device as a main constituent, and at least one load configured to operate while supplied with an output voltage from the power supply device.

8 Claims, 8 Drawing Sheets

POWER SUPPLY CONTROL DEVICE TO DISCHARGE AN OUTPUT VOLTAGE AT A TIME OF ENABLE INSTANTANEOUS INTERRUPTION

CROSS REFERENCE TO RELATED APPLICATIONS

This application claims priority benefit of Japanese Patent Application No. JP 2019-127025 filed in the Japan Patent Office on Jul. 8, 2019. Each of the above-referenced applications is hereby incorporated herein by reference in its entirety.

BACKGROUND

The disclosure disclosed in the present specification relates to a power supply control device.

Some existing power supply control devices have an output discharge function at a time of a disable transition.

Incidentally, Japanese Patent Laid-Open No. 2001-202141 can be cited as an example of an existing technology related to the foregoing.

SUMMARY

However, there is room for further improvement in output discharge operation at a time of enable instantaneous interruption in the existing power supply control devices.

In view of the above-described problems discovered by inventors of the present application, it is desirable to provide a power supply control device that can discharge an output voltage reliably even at a time of enable instantaneous interruption.

For example, a power supply control device disclosed in the present specification has a configuration (first configuration) including: a power supply unit configured to generate an output voltage from an input voltage; and an output discharge unit configured to start to discharge the output voltage when an instruction to disable the power supply unit is given, and continue discharging the output voltage until the output voltage falls below a predetermined threshold voltage or until a predetermined delay time passes while the output voltage does not fall below the threshold voltage even when an instruction to enable the power supply unit is given.

Incidentally, the power supply control device including the foregoing first configuration preferably has a configuration (second configuration) in which the output discharge unit includes: a discharge switch connected to a terminal to which the output voltage is applied; a timer configured to generate a delayed signal by delaying an enable signal giving an instruction to enable/disable the power supply unit by the delay time; a comparator configured to generate a comparison signal by comparing the output voltage and the threshold voltage with each other; and a discharge controller configured to generate a driving signal for the discharge switch on the basis of both the delayed signal and the comparison signal.

In addition, for example, a power supply control device disclosed in the present specification has a configuration (third configuration) including: a power supply unit configured to generate an output voltage from an input voltage; and an output discharge unit configured to start to discharge the output voltage when an instruction to disable the power supply unit is given, and continue discharging the output voltage until the output voltage falls below a predetermined threshold voltage even when an instruction to enable the power supply unit is given.

Incidentally, the power supply control device including the foregoing third configuration preferably has a configuration (fourth configuration) in which the output discharge unit includes: a discharge switch connected to a terminal to which the output voltage is applied; a comparator configured to generate a comparison signal by comparing the output voltage and the threshold voltage with each other; and a discharge controller configured to generate a driving signal for the discharge switch on the basis of both the comparison signal and an enable signal giving an instruction to enable/disable the power supply unit.

In addition, for example, a power supply control device disclosed in the present specification has a configuration (fifth configuration) including: a power supply unit configured to generate an output voltage from an input voltage; and an output discharge unit configured to start to discharge the output voltage when an instruction to disable the power supply unit is given, and continue discharging the output voltage until a predetermined delay time passes even when an instruction to enable the power supply unit is given.

Incidentally, the power supply control device including the foregoing fifth configuration preferably has a configuration (sixth configuration) in which the output discharge unit includes: a discharge switch connected to a terminal to which the output voltage is applied; and a timer configured to generate a driving signal for the discharge switch by delaying an enable signal giving an instruction to enable/disable the power supply unit by the delay time.

In addition, the power supply control device including one of the foregoing first to sixth configurations preferably has a configuration (seventh configuration) in which the power supply unit is disabled during discharging of the output voltage, and is enabled during a stop of the discharging of the output voltage.

In addition, the power supply control device including one of the foregoing first to seventh configurations preferably has a configuration (eighth configuration) in which the power supply unit is a part or a whole of a switching regulator or a linear regulator.

In addition, an electronic apparatus disclosed in the present specification has a configuration (ninth configuration) including: a power supply device including the power supply control device including one of the foregoing first to eighth configurations as a main constituent; and at least one load configured to operate while supplied with an output voltage from the power supply device.

Incidentally, the electronic apparatus including the foregoing ninth configuration preferably has a configuration (tenth configuration) in which the output discharge unit starts to discharge the output voltage when an instruction to disable the power supply unit is given, and continues discharging the output voltage until the output voltage falls below an under voltage locked out (UVLO) detection voltage lowest value set to each load even when an instruction to enable the power supply unit is given.

According to the disclosure disclosed in the present specification, it is possible to provide a power supply control device that can reliably discharge an output voltage even at a time of enable instantaneous interruption.

DETAILED DESCRIPTION OF THE PREFERRED EMBODIMENTS

Comparative Example

First, prior to description of a novel embodiment of a power supply device, a comparative example to be compared with this embodiment will be described briefly.

Figure 1:
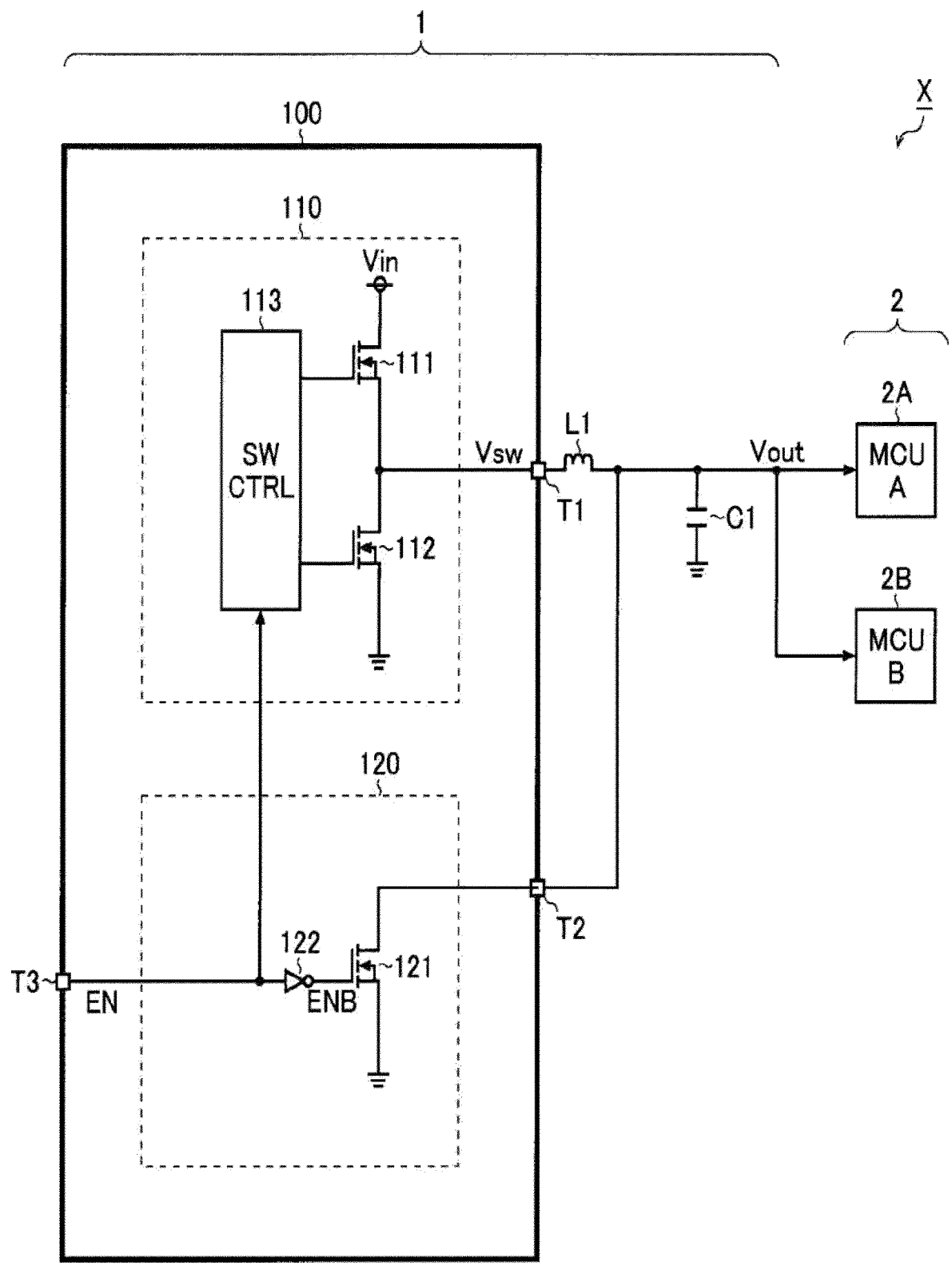
FIG. 1 is a diagram depicting a comparative example of a power supply device.

FIG. 1 is a diagram depicting a comparative example of a power supply device. A power supply device 1 according to the present comparative example is included in an electronic apparatus X (for example, a vehicle-mounted apparatus). The power supply device 1 generates a desired output voltage Vout (for example, 3.3 V) from an input voltage Vin (for example, a battery voltage of 5 to 12 V), and supplies the output voltage Vout to a load 2. Incidentally, the present figure depicts micro controller units (MCUs) 2A and 2B as the load 2 that operates while supplied with the output voltage Vout from the power supply device 1.

In addition, the power supply device 1 includes a power supply control device 100 (what is generally called power supply control integrated circuit (IC)) and various discrete parts (the present figure illustrates only an inductor L1 and a capacitor C1 for convenience of illustration) externally attached to the power supply control device 100.

The power supply control device 100 is a semiconductor integrated circuit device as a control entity of the power supply device 1. The power supply control device 100 is formed by integrating a power supply unit 110 and an output discharge unit 120 with each other. In addition, the power supply control device 100 has external terminals T1 to T3 as measures for establishing electric connection to the outside of the device.

Needless to say, the power supply control device 100 may include a functional block, an element, and an external terminal or the like other than those described above, or discrete parts other than those described above may be externally attached to the power supply control device 100.

The power supply unit 110 is a functional block that forms a step-down switching regulator in conjunction with the external inductor L1 and the external capacitor C1. The power supply unit 110 includes an output switch 111, a synchronous rectification switch 112, and a switch controller 113.

The output switch 111 and the synchronous rectification switch 112 are directly connected between an input terminal of the input voltage Vin and a grounding terminal. The output switch 111 and the synchronous rectification switch 112 function as a half bridge output stage that outputs, to an external terminal T1, a pulsed switch voltage Vsw appearing at a connection node between the output switch 111 and the synchronous rectification switch 112.

The external terminal T1 is connected with a first terminal of the inductor L1. A second terminal of the inductor L1 and a first terminal of the capacitor C1 are connected to an output terminal of the output voltage Vout. A second terminal of the capacitor C1 is connected to the grounding terminal. The inductor L1 and the capacitor C1 thus connected function as an LC filter that generates the output voltage Vout by smoothing the pulsed switch voltage Vsw.

The switch controller 113 complementarily turns on/off the output switch 111 and the synchronous rectification switch 112 so that the output voltage Vout coincides with a target value. Here, the word "complementarily" in the present specification is to be construed broadly as a word including not only a case where the on/off states of the output switch 111 and the synchronous rectification switch 112 are completely reversed but also a case where a simultaneous off time (what is generally called dead time) of the output switch 111 and the synchronous rectification switch 112 is provided to prevent a through current.

Incidentally, as for an output feedback control system of the switch controller 113, it suffices to adopt any systems such as an error amplifier control system (system that generates an error signal between the output voltage Vout and a target value by using an error amplifier, and performs pulse width modulation (PWM) control of an on duty of the output switch 111 according to a result of comparison between the error signal and a slope signal), a bottom detection on time fixing system (system that sets the output switch 111 in an on state for a predetermined on time from bottom detection timing of the output voltage Vout, and thereafter sets the output switch 111 in an off state until next bottom detection timing), a peak detection off time fixing system (system that sets the output switch 111 in an off state for a predetermined off time from peak detection timing of the output voltage Vout, and thereafter sets the output switch 111 in an on state until next peak detection timing), a hysteresis control system (system that performs peak detection and bottom detection for the output voltage Vout, and performs on/off control of the output switch 111 according to a result of the detection), or the like. In addition, in the above-described error amplifier control system, either voltage mode control or current mode control may be performed.

In addition, while each of the output switch 111 and the synchronous rectification switch 112 is an N-channel type metal oxide semiconductor field effect transistor (NMOSFET) in the present figure, a P-channel type MOSFET (PMOSFET) may be used as the output switch 111, for example.

In addition, the output switch 111 and the synchronous rectification switch 112 may be externally attached as discrete parts to the power supply control device 100. In that case, external terminals for outputting respective gate signals for the output switch 111 and the synchronous rectification switch 112 are used.

In addition, a rectifying system of the switching regulator is not limited to a synchronous rectification system, but a diode rectification system may be adopted as the rectifying system of the switching regulator. In that case, it suffices to include a rectifier diode in the power supply control device 100 or externally attach a rectifier diode to the power supply control device 100 in place of the synchronous rectification switch 112.

In addition, an output form of the switching regulator is not limited to the step-down type, but may be a step-up type, a step-up/down type, or an inversion type.

Further, the power supply unit 110 may not function as a part or the whole of the switching regulator, but may function as a part or the whole of a linear regulator, for example.

The output discharge unit 120 is a functional block that discharges the output voltage Vout according to an enable signal EN input to the external terminal T3. The output discharge unit 120 includes a discharge switch 121 and an inverter 122. Incidentally, the enable signal EN is input to the power supply unit 110 (the switch controller 113, in particular), and is a binary logic signal that is at a high level when the power supply unit 110 is enabled (operating state), and is at a low level when the power supply unit 110 is disabled (stop state).

When the power supply unit 110 is enabled, for example, the output switch 111 and the synchronous rectification switch 112 are complementarily turned on/off as described above, and a desired output voltage Vout is generated from the input voltage Vin. When the power supply unit 110 is disabled, on the other hand, the output switch 111 and the synchronous rectification switch 112 are both turned off, and the external terminal T1 is set at a high impedance (Hi-Z).

Incidentally, while an example is cited in the present figure in which the enable signal EN is input from the outside of the power supply control device 100 to the output discharge unit 120 via the external terminal T3, there can be a case where the enable signal EN (or an abnormality protection signal corresponding thereto) is, for example, input from an abnormality protecting unit (not depicted) included in the power supply control device 100 to the output discharge unit 120.

The discharge switch 121 is connected between the external terminal T2 and the grounding terminal. The discharge switch 121 is turned on/off according to an inverted enable signal ENB (logically inverted signal of the enable signal EN). Specifically, the discharge switch 121 is on when ENB=H, and is off when ENB=L. Incidentally, the external terminal T2 is connected to the output terminal of the output voltage Vout. Hence, the output voltage Vout is discharged when the discharge switch 121 is on, and the discharging of the output voltage Vout is stopped when the discharge switch 121 is off.

The inverter 122 generates the inverted enable signal ENB by inverting the logic level of the enable signal EN. Hence, the inverted enable signal ENB is at a low level when the enable signal EN is at a high level (logic level at an enable time), and is at a high level when the enable signal EN is at a low level (logic level at a disable time).

Figure 2:
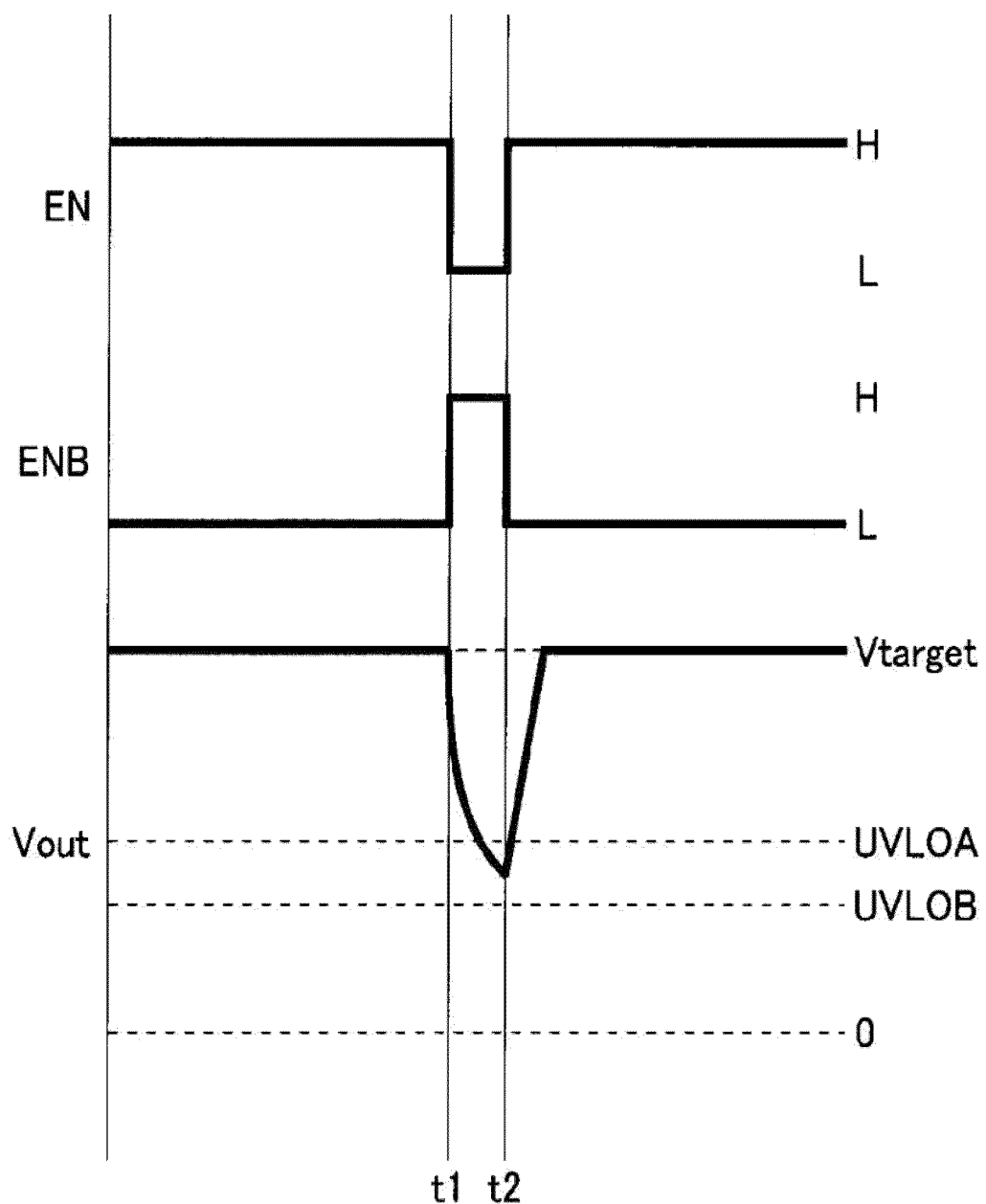
FIG. 2 is a diagram depicting output discharge operation in the comparative example.

FIG. 2 is a timing diagram depicting output discharge operation (output discharge operation at a time of enable instantaneous interruption, in particular) in the comparative example. FIG. 2 depicts, from a top in order, the enable signal EN, the inverted enable signal ENB, and the output voltage Vout.

Incidentally, UVLOA and UVLOB in the present figure are UVLO detection voltages (low voltage abnormality detection threshold values) set to the MCUs 2A and 2B, respectively. Here, suppose that UVLOA>UVLOB (UVLOA=2.5 V and UVLOB=2.3 V, for example). The MCU 2A detects a low voltage abnormality in the output voltage Vout and resets itself when Vout<UVLOA. Similarly, the MCU 2B detects a low voltage abnormality in the output voltage Vout and resets itself when Vout<UVLOB.

Before time t1, the enable signal EN is at a high level (logic level during an enable time). Hence, the inverted enable signal ENB is at a low level. The discharge switch 121 is therefore in an off state. As a result, the output voltage Vout is maintained at predetermined target value Vtarget without being discharged by the output discharge unit 120.

When the enable signal EN falls from the high level to a low level (logic level during a disable time) at time t1, the inverted enable signal ENB rises from the low level to a high level, and therefore the discharge switch 121 is turned on. As a result, the output terminal of the output voltage Vout and the grounding terminal are short-circuited. The output voltage Vout therefore starts to decrease from the target value Vtarget.

When the enable signal EN rises to the high level again at time t2, the inverted enable signal ENB falls to the low level again, and therefore the discharge switch 121 is turned off. As a result, the output discharge operation is stopped, and the output voltage Vout turns from decrease to increase.

Here, at a time of enable instantaneous interruption (at a time of a momentary fall of the enable signal EN due to superimposition of noise or the like), the low level period (time t1 to t2) of the enable signal EN is very short, and therefore the power supply unit 110 returns to an enabled state without the output voltage Vout being discharged sufficiently.

Making description based on the present figure, at a point in time that the enable signal EN rises from the low level to the high level and the output discharge operation by the output discharge unit 120 is stopped at time t2, the output voltage Vout is a halfway voltage value (UVLOB<Vout<UVLOA) at which the MCU 2A detects a low voltage abnormality, but the MCU 2B does not detect the low voltage abnormality. When a situation is thus caused in which only one of the MCUs 2A and 2B (MCU 2A in the present figure) is reset, the system as a whole of the electronic apparatus X may invite erroneous operation.

In addition, there is a desire in the market to "reset the load 2 reliably when the enable signal EN falls to the low level even if the fall is momentary" irrespective of whether the load 2 is single or plural. In order to meet such a desire in the market, the output voltage Vout needs to be discharged until the output voltage Vout falls below the UVLO detection voltage set to the load 2 (UVLO detection voltage lowest values set respectively when the load 2 is plural) even at a time of enable instantaneous interruption.

In the following, in view of the foregoing consideration, a novel embodiment is proposed which can discharge the output voltage Vout reliably even at a time of enable instantaneous interruption.

First Embodiment

Figure 3:
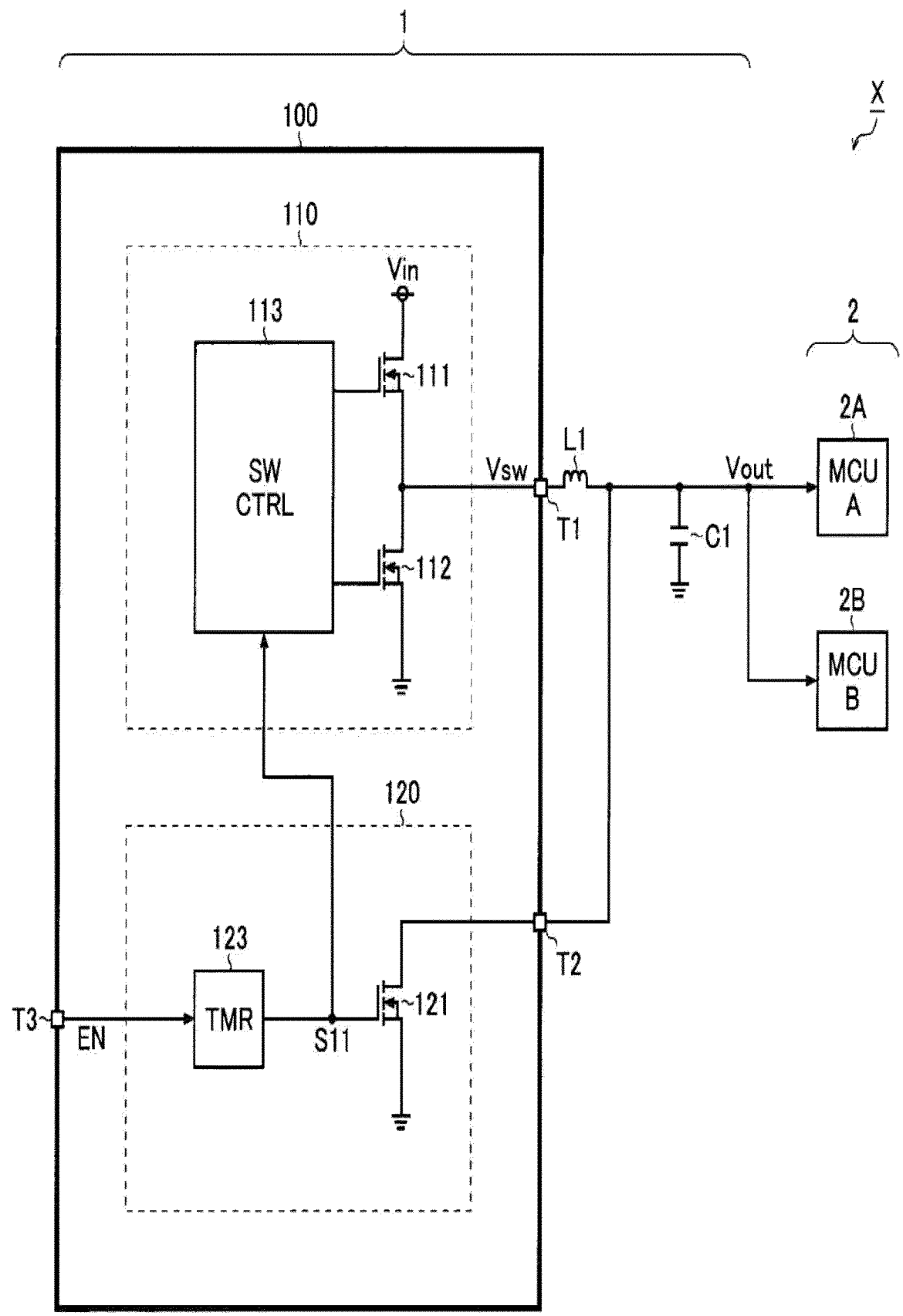
FIG. 3 is a diagram depicting a first embodiment of the power supply device.

FIG. 3 is a diagram depicting a first embodiment of the power supply device. While the power supply device 1 according to the present embodiment is based on the aforementioned comparative example (FIG. 1), the power supply device 1 according to the present embodiment has a novel contrivance applied to the configuration of the power supply control device 100 (the output discharge unit 120, in particular). More specifically, the output discharge unit 120 includes a timer 123 in addition to the aforementioned discharge switch 121.

The timer 123 generates a driving signal S11 for the discharge switch 121 by delaying the enable signal EN by a predetermined delay time Tdly (for example, 100 ms). The timer 123 may be an analog timer, or may be a digital timer.

For example, the timer 123 raises the driving signal S11 to a high level without delay when the enable signal EN falls to a low level. When the enable signal EN rises to a high level, on the other hand, the timer 123 lowers the driving signal S11 to a low level after waiting for the passage of the delay time Tdly.

Incidentally, the discharge switch 121 is on when S11=H, and is off when S11=L. Hence, the introduction of the timer 123 can extend the on period of the discharge switch 121 (discharge period of the output voltage Vout) until the passage of the delay time Tdly.

The driving signal S11 is also input as an internal enable signal of the power supply unit 110 to the switch controller 113. For example, the switch controller 113 turns off both the output switch 111 and the synchronous rectification switch 112 when the driving signal S11 is at the high level, and complementarily turns on/off the output switch 111 and the synchronous rectification switch 112 when the driving signal S11 is at the low level. In other words, the power supply unit 110 is disabled during the discharging of the output voltage Vout (S11=H), and is enabled during a stop of the discharging of the output voltage Vout (S11=L).

Figure 4:
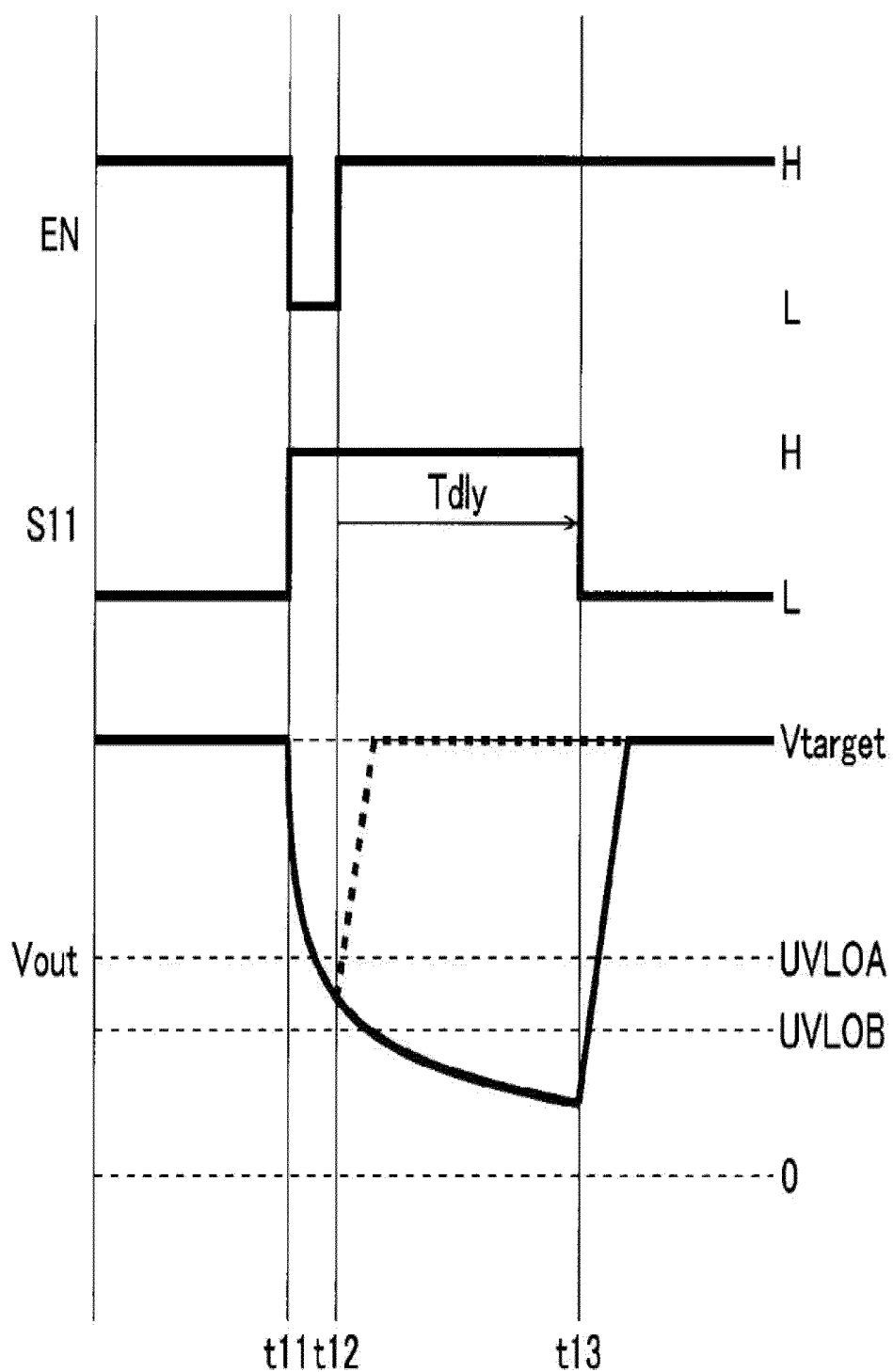
FIG. 4 is a diagram depicting output discharge operation in the first embodiment.

FIG. 4 is a timing diagram depicting output discharge operation in the first embodiment (output discharge operation at a time of enable instantaneous interruption, in particular). FIG. 4 depicts, from a top in order, the enable signal EN, the driving signal S11, and the output voltage Vout. Incidentally, a broken line of the output voltage Vout represents the behavior of the comparative example (FIG. 2).

Before time t11, the enable signal EN is at a high level (logic level during an enable time). At this time, the driving signal S11 is at a low level. The discharge switch 121 is therefore in an off state. As a result, the output voltage Vout is maintained at a predetermined target value Vtarget without being discharged by the output discharge unit 120.

When the enable signal EN falls from the high level to a low level (logic level during a disable time) at time t11, the driving signal S11 rises from the low level to a high level without delay, and therefore the discharge switch 121 is turned on. As a result, the output terminal of the output voltage Vout and the grounding terminal are short-circuited. The output voltage Vout therefore starts to decrease from the target value Vtarget. The output discharge unit 120 thus promptly starts to discharge the output voltage Vout at a point in time that an instruction to disable the power supply unit 110 is given.

When the enable signal EN rises to the high level again at time t12, counting of the delay time Tdly is started. At this time, the driving signal S11 does not immediately fall to the low level even when the enable signal EN rises to the high level. The driving signal S11 is maintained at the high level until the delay time Tdly passes. As a result, the discharge switch 121 remains on, and therefore the output voltage Vout further decreases, unlike the aforementioned comparative example (broken line). The output discharge unit 120 thus continues discharging the output voltage Vout until the passage of the delay time Tdly even when an instruction to enable the power supply unit 110 is given.

When the delay time Tdly has passed since the rising of the enable signal EN at time t13, the driving signal S11 falls to the low level, and therefore the discharge switch 121 is turned off. As a result, the output discharge operation is stopped, and the output voltage Vout turns from decrease to increase.

Here, when the delay time Tdly is set appropriately, the output voltage Vout can be discharged until the output voltage Vout falls below the UVLO detection voltage set to the load 2 (the UVLO detection voltage lowest values set respectively when the load 2 is plural) even at a time of enable instantaneous interruption.

Making description based on the present figure, at a point in time that the driving signal S11 falls from the high level to the low level and the output discharge operation by the output discharge unit 120 is stopped at time t13, the output voltage Vout is a voltage value (Vout<UVLOB<UVLOA) at which both of the MCUs 2A and 2B detect a low voltage abnormality. Hence, both of the MCUs 2A and 2B are reset. There is thus no fear of the system as a whole of the electronic apparatus X inviting erroneous operation.

In addition, according to the present embodiment, it is possible to meet the desire in the market to "reset the load 2 reliably when the enable signal EN falls to the low level even if the fall is momentary" irrespective of whether the load 2 is single or plural.

Second Embodiment

Figure 5:
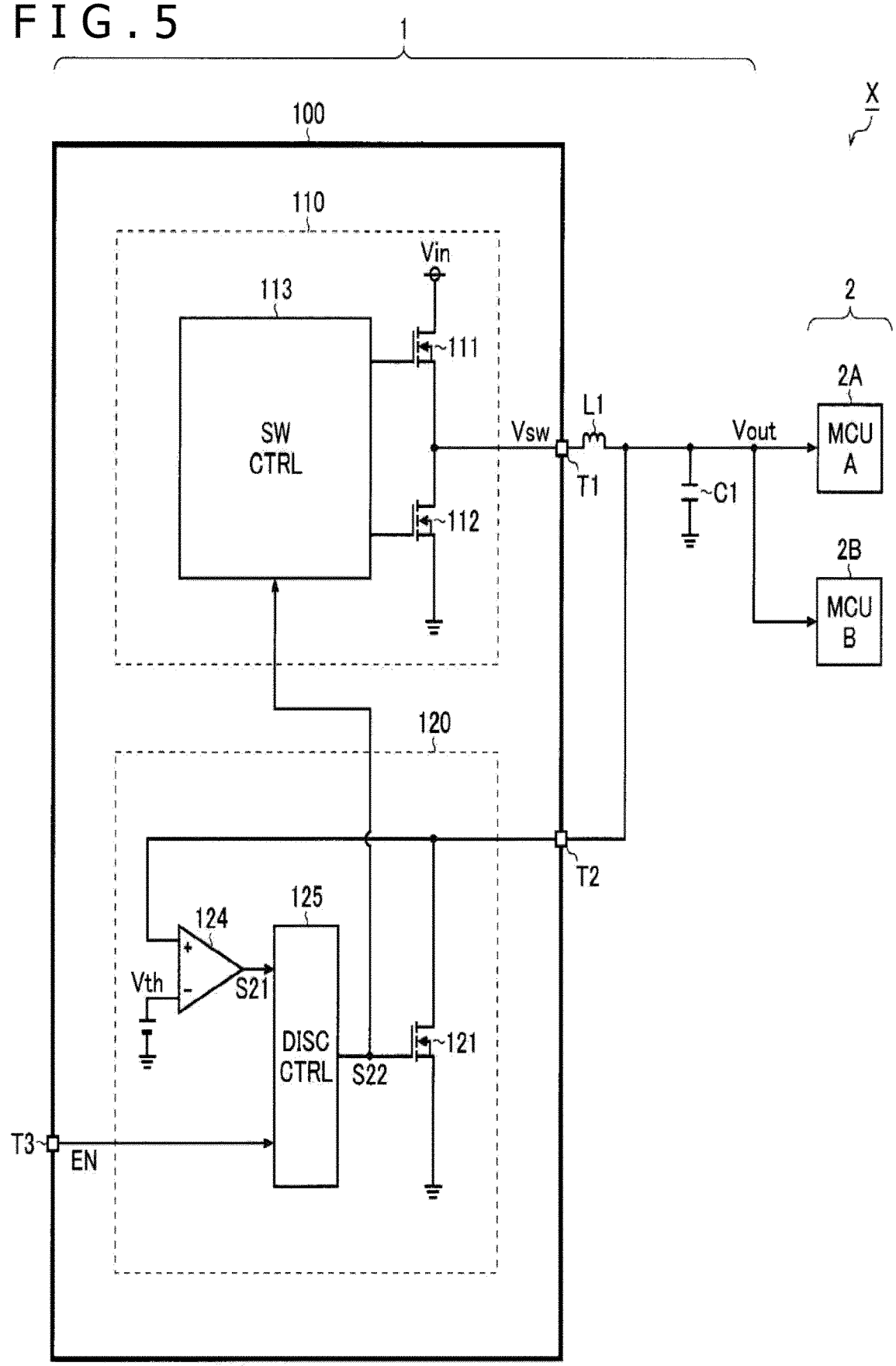
FIG. 5 is a diagram depicting a second embodiment of the power supply device.

FIG. 5 is a diagram depicting a second embodiment of the power supply device. While the power supply device 1 according to the present embodiment is based on the aforementioned comparative example (FIG. 1), the power supply device 1 according to the present embodiment has a novel contrivance applied to the configuration of the power supply control device 100 (the output discharge unit 120, in particular). More specifically, the output discharge unit 120 includes a comparator 124 and a discharge controller 125 in addition to the aforementioned discharge switch 121.

The comparator 124 generates a comparison signal S21 by comparing the output voltage Vout (or a divided voltage of the output voltage Vout) input to a non-inverting input terminal (+) with a threshold voltage Vth (for example, 0.2 V) input to an inverting input terminal (−). The comparison signal S21 is at a high level when Vout>Vth, and is at a low level when Vout<Vth.

The discharge controller 125 generates a driving signal S22 for the discharge switch 121 on the basis of both the comparison signal S21 and the enable signal EN. For example, the discharge controller 125 raises the driving signal S22 to a high level when the enable signal EN falls to a low level, and lowers the driving signal S22 to a low level when the comparison signal S21 falls to a low level.

Incidentally, the discharge switch 121 is on when S22=H, and is off when S22=L. Hence, the introduction of the comparator 124 and the discharge controller 125 can extend the on period of the discharge switch 121 (discharge period of the output voltage Vout) until the output voltage Vout falls below the threshold voltage Vth.

The driving signal S22 is also input as an internal enable signal of the power supply unit 110 to the switch controller 113. For example, the switch controller 113 turns off both the output switch 111 and the synchronous rectification switch 112 when the driving signal S22 is at the high level, and complementarily turns on/off the output switch 111 and the synchronous rectification switch 112 when the driving signal S22 is at the low level. In other words, the power supply unit 110 is disabled during the discharging of the output voltage Vout (S22=H), and is enabled during a stop of the discharging of the output voltage Vout (S22=L).

Figure 6:
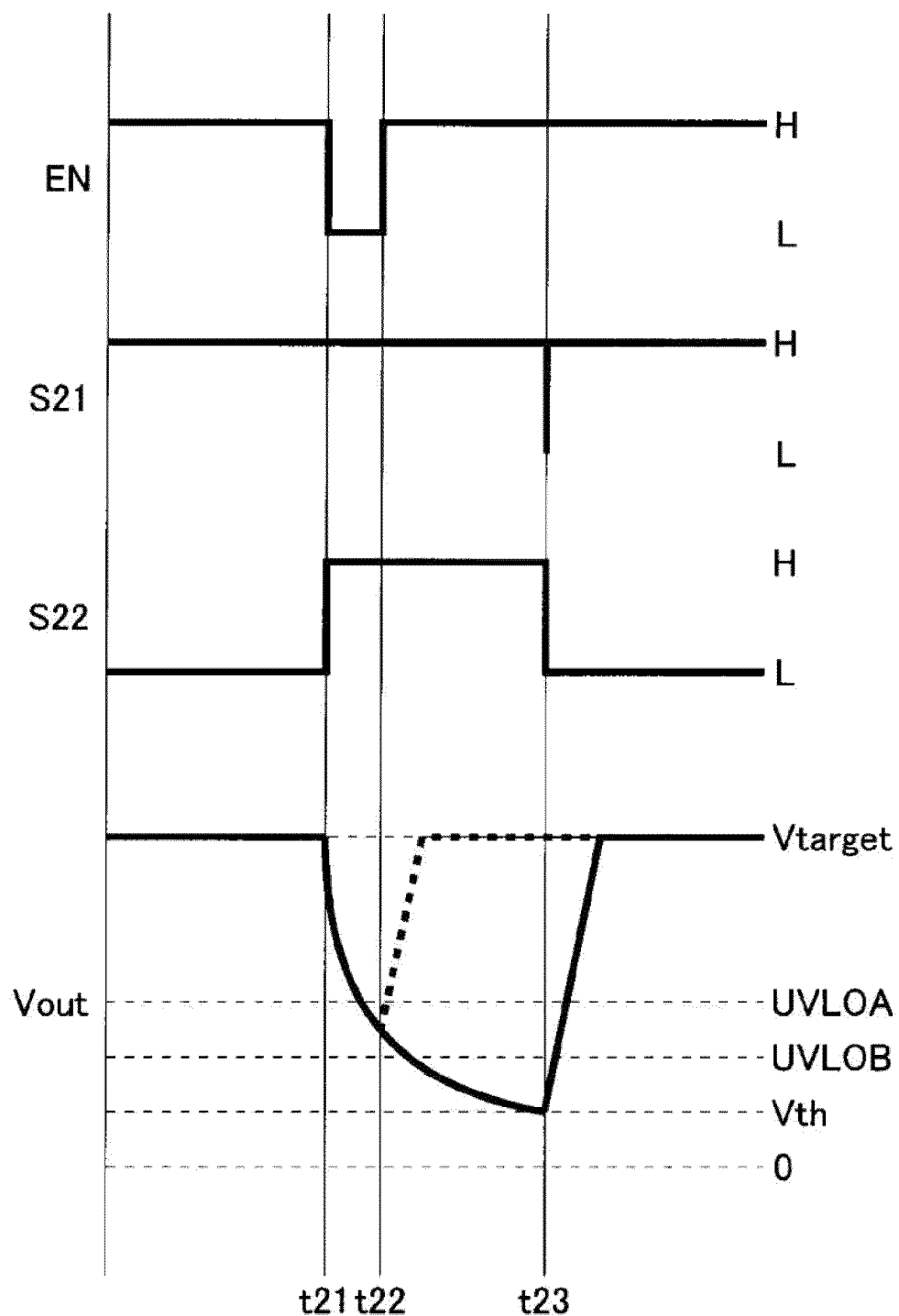
FIG. 6 is a diagram depicting output discharge operation in the second embodiment.

FIG. 6 is a timing diagram depicting output discharge operation in the second embodiment (output discharge operation at a time of enable instantaneous interruption, in particular). FIG. depicts, from a top in order, the enable signal EN, the comparison signal S21, the driving signal S22, and the output voltage Vout. Incidentally, a broken line of the output voltage Vout represents the behavior of the comparative example (FIG. 2).

Before time t21, the enable signal EN is at a high level (logic level during an enable time). At this time, the comparison signal S21 is at a high level, and the driving signal S22 is at a low level. The discharge switch 121 is therefore in an off state. As a result, the output voltage Vout is maintained at a predetermined target value Vtarget without being discharged by the output discharge unit 120.

When the enable signal EN falls from the high level to a low level (logic level during a disable time) at time t21, the driving signal S22 rises from the low level to a high level, and therefore the discharge switch 121 is turned on. As a result, the output terminal of the output voltage Vout and the grounding terminal are short-circuited. The output voltage Vout therefore starts to decrease from the target value Vtarget. The output discharge unit 120 thus promptly starts to discharge the output voltage Vout at a point in time that an instruction to disable the power supply unit 110 is given.

When the enable signal EN rises to the high level again at time t22, the output voltage Vout has not yet fallen below the threshold voltage Vth, so that the comparison signal S21 remains at the high level. As a result, the driving signal S22 is maintained at the high level, and the discharge switch 121 remains on. The output voltage Vout therefore further decreases, unlike the aforementioned comparative example (broken line). The output discharge unit 120 thus continues discharging the output voltage Vout until the output voltage Vout falls below the threshold voltage Vth even when an instruction to enable the power supply unit 110 is given.

When the output voltage Vout falls below the threshold voltage Vth at time t23, the comparison signal S21 falls to a low level, and further the driving signal S22 falls to the low level. The discharge switch 121 is therefore turned off. As a result, the output discharge operation is stopped, and the output voltage Vout turns from decrease to increase.

Here, when the threshold voltage Vth is set appropriately, the output voltage Vout can be discharged until the output voltage Vout falls below the UVLO detection voltage set to the load 2 (the UVLO detection voltage lowest values set respectively when the load 2 is plural) even at a time of enable instantaneous interruption.

Making description based on the present figure, at a point in time that the driving signal S22 falls from the high level to the low level and the output discharge operation by the output discharge unit 120 is stopped at time t23, the output voltage Vout is at a voltage value (Vout<UVLOB<UVLOA) at which both of the MCUs 2A and 2B detect a low voltage abnormality. Hence, both of the MCUs 2A and 2B are reset. There is thus no fear of the system as a whole of the electronic apparatus X inviting erroneous operation.

In addition, according to the present embodiment, it is possible to meet the desire in the market to "reset the load 2 reliably when the enable signal EN falls to the low level even if the fall is momentary" irrespective of whether the load 2 is single or plural. These actions and effects are similar to those of the foregoing first embodiment.

Third Embodiment

Figure 7:
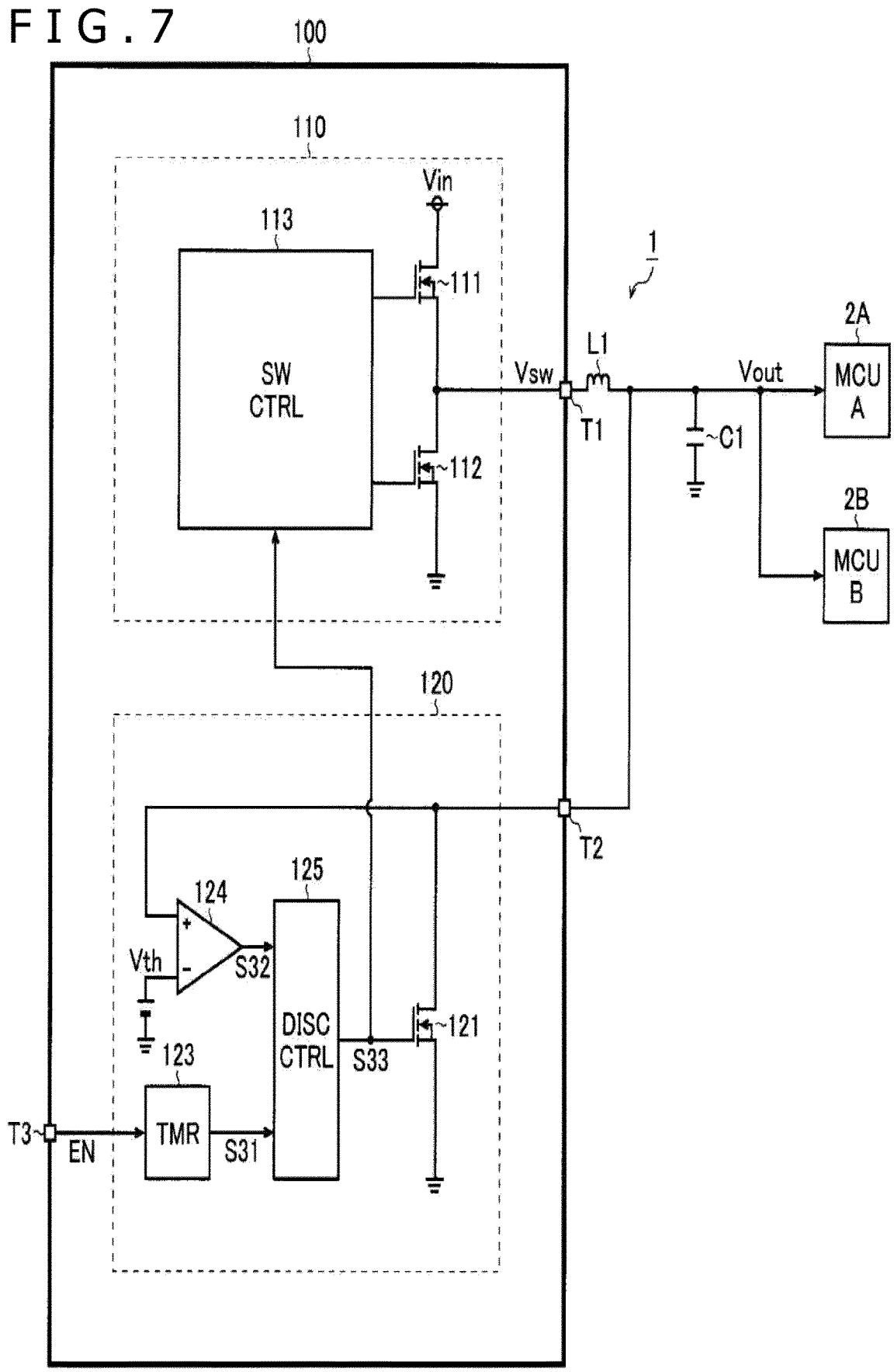
FIG. 7 is a diagram depicting a third embodiment of the power supply device.

FIG. 7 is a diagram depicting a third embodiment of the power supply device. While the power supply device 1 according to the present embodiment is based on the aforementioned comparative example (FIG. 1), the power supply device 1 according to the present embodiment has a novel contrivance applied to the configuration of the power supply control device 100 (the output discharge unit 120, in particular). More specifically, the output discharge unit 120 includes a timer 123, a comparator 124, and a discharge controller 125 in addition to the aforementioned discharge switch 121. As viewed from another aspect, the output discharge unit 120 can also be understood as a configuration obtained by combining the aforementioned first embodiment (FIG. 3) with the aforementioned second embodiment (FIG. 5).

The timer 123 generates a delayed signal S31 by delaying the enable signal EN by a predetermined delay time Tdly (for example, 100 ms). The timer 123 may be an analog timer, or may be a digital timer.

For example, the timer 123 lowers the delayed signal S31 to a low level without delay when the enable signal EN falls to a low level. When the enable signal EN rises to a high level, on the other hand, the timer 123 raises the delayed signal S31 to a high level after waiting for the passage of the delay time Tdly.

The comparator 124 generates a comparison signal S32 by comparing the output voltage Vout (or a divided voltage of the output voltage Vout) input to a non-inverting input terminal (+) with a threshold voltage Vth (for example, 0.2 V) input to an inverting input terminal (−). The comparison signal S32 is at a high level when Vout>Vth, and is at a low level when Vout<Vth.

The discharge controller 125 generates a driving signal S33 for the discharge switch 121 on the basis of both the delayed signal S31 and the comparison signal S32. For example, the discharge controller 125 raises the driving signal S33 to a high level when the delayed signal S31 falls to a low level, whereas the discharge controller 125 lowers the driving signal S33 to a low level when the comparison signal S32 falls to a low level, or when the delayed signal S31 rises to a high level while the comparison signal S32 is maintained at a high level.

Incidentally, the discharge switch 121 is on when S33=H, and is off when S33=L. Hence, the introduction of the timer 123, the comparator 124, and the discharge controller 125 can extend the on period of the discharge switch 121 (discharge period of the output voltage Vout) until the output voltage Vout falls below the threshold voltage Vth or until the delay time Tdly passes while the output voltage Vout has not fallen below the threshold voltage Vth.

The driving signal S33 is also input as an internal enable signal of the power supply unit 110 to the switch controller 113. For example, the switch controller 113 turns off both the output switch 111 and the synchronous rectification switch 112 when the driving signal S33 is at the high level, and complementarily turns on/off the output switch 111 and the synchronous rectification switch 112 when the driving signal S33 is at the low level. In other words, the power supply unit 110 is disabled during the discharging of the output voltage Vout (S33=H), and is enabled during a stop of the discharging of the output voltage Vout (S33=L).

Figure 8:
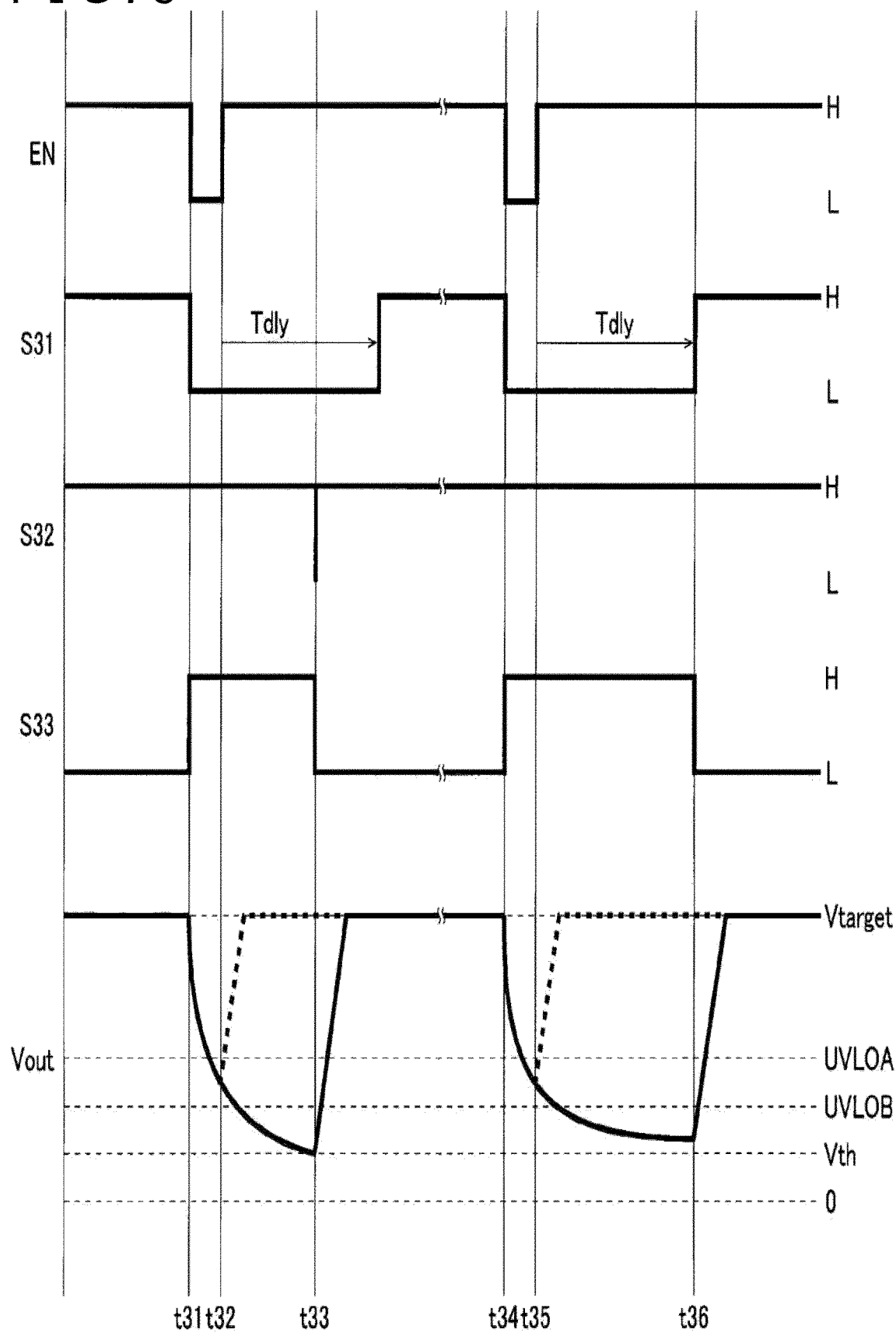
FIG. 8 is a diagram depicting output discharge operation in the third embodiment.

FIG. 8 is a timing diagram depicting output discharge operation in the third embodiment (output discharge operation at a time of enable instantaneous interruption, in particular). FIG. 8 depicts, from a top in order, the enable signal EN, the delayed signal S31, the comparison signal S32, the driving signal S33, and the output voltage Vout. Incidentally, a broken line of the output voltage Vout represents the behavior of the comparative example (FIG. 2).

Description will first be made of a case where the output discharge operation of the output discharge unit 120 causes the output voltage Vout to fall below the threshold voltage Vth (times t31 to t33).

Before time t31, the enable signal EN is at a high level (logic level during an enable time). At this time, both the delayed signal S31 and the comparison signal S32 are at a high level, and the driving signal S33 is at a low level. The discharge switch 121 is therefore in an off state. As a result, the output voltage Vout is maintained at a predetermined target value Vtarget without being discharged by the output discharge unit 120.

When the enable signal EN falls from the high level to a low level (logic level during a disable time) at time t31, the delayed signal S31 falls from the high level to a low level without delay, and the driving signal S33 rises from the low level to a high level. The discharge switch 121 is therefore turned on. As a result, the output terminal of the output voltage Vout and the grounding terminal are short-circuited. The output voltage Vout therefore starts to decrease from the target value Vtarget. The output discharge unit 120 thus promptly starts to discharge the output voltage Vout at a point in time that an instruction to disable the power supply unit 110 is given.

When the enable signal EN rises to the high level again at time t32, counting of the delay time Tdly is started. At this time, even when the enable signal EN rises to the high level, the delayed signal S31 does not immediately rises to the high level, but is maintained at the low level until the delay time Tdly passes. In addition, at this point in time, the output voltage Vout has not yet fallen below the threshold voltage Vth, and therefore the comparison signal S32 remains at the high level. As a result, the driving signal S33 is maintained at the high level, and the discharge switch 121 remains on. The output voltage Vout therefore further decreases, unlike the aforementioned comparative example (broken line).

When the output voltage Vout falls below the threshold voltage Vth at time t33 before the delay time Tdly passes, the comparison signal S32 falls to a low level, and further the driving signal S33 falls to the low level. The discharge switch 121 is therefore turned off. As a result, the output discharge operation is stopped, and the output voltage Vout turns from decrease to increase.

Description will next be made of a case where the output discharge operation of the output discharge unit 120 does not cause the output voltage Vout to fall below the threshold voltage Vth (times t34 to t36).

Before time t34, the enable signal EN is at a high level (logic level during an enable time). At this time, both the delayed signal S31 and the comparison signal S32 are at a high level, and the driving signal S33 is at a low level. The discharge switch 121 is therefore in an off state. As a result, the output voltage Vout is maintained at a predetermined target value Vtarget without being discharged by the output discharge unit 120.

When the enable signal EN falls from the high level to a low level (logic level during a disable time) at time t34, the delayed signal S31 falls from the high level to a low level without delay, and the driving signal S33 rises from the low level to a high level. The discharge switch 121 is therefore turned on. As a result, the output terminal of the output voltage Vout and the grounding terminal are short-circuited. The output voltage Vout therefore starts to decrease from the target value Vtarget. The output discharge unit 120 thus promptly starts to discharge the output voltage Vout at a point in time that an instruction to disable the power supply unit 110 is given.

When the enable signal EN rises to the high level again at time t35, counting of the delay time Tdly is started. At this time, even when the enable signal EN rises to the high level, the delayed signal S31 does not immediately rises to the high level, but is maintained at the low level until the delay time Tdly passes. In addition, at this point in time, the output voltage Vout has not yet fallen below the threshold voltage Vth, and therefore the comparison signal S32 remains at the high level. As a result, the driving signal S33 is maintained at the high level, and the discharge switch 121 remains on. The output voltage Vout therefore further decreases, unlike the aforementioned comparative example (broken line).

When the delay time Tdly has passed while the output voltage Vout has not fallen below the threshold voltage Vth at time t36, the delayed signal S31 rises to the high level, and further the driving signal S33 falls to the low level. The discharge switch 121 is therefore turned off. As a result, the output discharge operation is stopped, and the output voltage Vout turns from decrease to increase.

The output discharge unit 120 thus continues discharging the output voltage Vout until the output voltage Vout falls below the threshold voltage Vth or until the delay time Tdly passes while the output voltage Vout has not fallen below the threshold voltage Vth even when an instruction to enable the power supply unit 110 is given.

Here, when the threshold voltage Vth and the delay time Tdly are set appropriately, the output voltage Vout can be discharged until the output voltage Vout falls below the UVLO detection voltage set to the load 2 (the UVLO detection voltage lowest values set respectively when the load 2 is plural) even at a time of enable instantaneous interruption.

Making description based on the present figure, at points in time that the driving signal S33 falls from the high level to the low level and the output discharge operation by the output discharge unit 120 is stopped at times t33 and t36, the output voltage Vout is at a voltage value (Vout<UVLOB<UVLOA) at which both of the MCUs 2A and 2B detect a low voltage abnormality. Hence, both of the MCUs 2A and 2B are reset. There is thus no fear of the system as a whole of the electronic apparatus X inviting erroneous operation.

In addition, according to the present embodiment, it is possible to meet the desire in the market to "reset the load 2 reliably when the enable signal EN falls to the low level even if the fall is momentary" irrespective of whether the load 2 is single or plural. These actions and effects are not at all different from those of the foregoing first and second embodiments.

Further, according to the present embodiment, when the output voltage Vout falls below the threshold voltage Vth, the output discharge operation can be stopped without waiting for the passage of the delay time Tdly. The power supply unit 110 can therefore be restarted more promptly than in the foregoing first embodiment (FIG. 3). When the output voltage Vout does not fall below the threshold voltage Vth, on the other hand, the output discharge operation can be stopped at a point in time that the delay time Tdly passes. The power supply unit 110 can therefore be restarted more reliably than in the foregoing second embodiment (FIG. 5).

Other Modifications

It is to be noted that various technical features disclosed in the present specification can be modified variously besides the foregoing embodiments without departing from the spirit of technical creation thereof. That is, the foregoing embodiments are to be considered illustrative and not restrictive in all respects, and it is to be understood that the technical scope of the present disclosure is not limited to the foregoing embodiments, but includes all modifications belonging within meanings and ranges equivalent to claims.

The disclosure disclosed in the present specification is applicable to a vehicle-mounted power supply, for example.

What is claimed is:

1. A power supply control device, comprising:
a power supply unit configured to generate an output voltage from an input voltage; and
an output discharge unit including:
a discharge switch connected to a terminal to which the output voltage is applied;
a timer configured to:
receive an enable signal including one of:
an instruction to disable the power supply unit, or
an instruction to enable the power supply unit; and
delay the enable signal by a predetermined delay time to generate a delayed signal;
a comparator configured to compare the output voltage with a predetermined threshold voltage to generate a comparison signal; and
a discharge controller configured to generate a driving signal for the discharge switch based on the delayed signal and the comparison signal, wherein the output discharge unit is configured to:
start discharge of the output voltage based on the reception of the enable signal including the instruction to disable the power supply unit, and
continue, even when the enable signal including the instruction to enable the power supply unit is received, the discharge of the output voltage until one of:
the output voltage falls below the predetermined threshold voltage, or
the predetermined delay time passes while the output voltage does not fall below the predetermined threshold voltage.

2. A power supply control device, comprising:
a power supply unit configured to generate an output voltage from an input voltage; and
an output discharge unit configured to:
receive an enable signal including one of:
an instruction to disable the power supply unit, or
an instruction to enable the power supply unit;
start discharge of the output voltage based on the reception of the enable signal including the instruction to disable the power supply unit;
compare the output voltage with a predetermined threshold voltage to generate a comparison signal;
generate a driving signal based on the comparison signal and the enable signal;
input the driving signal to the power supply unit; and
continue, based on the driving signal, the discharge of the output voltage until the output voltage falls below the predetermined threshold voltage even when the enable signal including the instruction to enable the power supply unit is received, wherein the power supply unit is further configured to be one of enabled or disabled based on the driving signal from the output discharge unit.

3. The power supply control device according to claim 2, wherein the output discharge unit includes:
a discharge switch connected to a terminal to which the output voltage is applied;
a comparator configured to compare the output voltage with the predetermined threshold voltage to generate the comparison signal; and
a discharge controller configured to generate the driving signal for the discharge switch based on the comparison signal and the enable signal.

4. A power supply control device, comprising:
a power supply unit configured to generate an output voltage from an input voltage; and
an output discharge unit including:
a discharge switch connected to a terminal to which the output voltage is applied; and
a timer configured to:
receive an enable signal including one of:
an instruction to disable the power supply unit, or
an instruction to enable the power supply unit; and
delay the enable signal by a predetermined delay time to generate a driving signal for the discharge switch, wherein the output discharge unit is configured to:
start discharge of the output voltage based on the reception of the enable signal including the instruction to disable the power supply unit, and
continue the discharge of the output voltage until the predetermined delay time passes even when the enable signal including the instruction to enable the power supply unit is received.

5. The power supply control device according to claim 1, wherein the power supply unit is further configured to be:
disabled during the discharge of the output voltage; and
enabled during a stop of the discharge of the output voltage.

6. The power supply control device according to claim 1, wherein the power supply unit is one of a part or a whole of one of a switching regulator or a linear regulator.

7. An electronic apparatus, comprising:
a power supply device including a power supply control device, wherein the power supply control device includes:
a power supply unit configured to generate an output voltage from an input voltage; and
an output discharge unit including:
a discharge switch connected to a terminal to which the output voltage is applied;
a timer configured to:
receive an enable signal including one of:
an instruction to disable the power supply unit, or
an instruction to enable the power supply unit; and
delay the enable signal by a predetermined delay time to generate a delayed signal;
a comparator configured to compare the output voltage with a predetermined threshold voltage to generate a comparison signal; and
a discharge controller configured to generate a driving signal for the discharge switch based on the delayed signal and the comparison signal, wherein the output discharge unit is configured to:
start discharge of the output voltage based on the reception of the enable signal including the instruction to disable the power supply unit, and
continue, even when the enable signal including the instruction to enable the power supply unit is received, the discharge of the output voltage until one of:
the output voltage falls below the predetermined threshold voltage, or
the predetermined delay time passes while the output voltage does not fall below the predetermined threshold voltage; and
at least one load configured to operate while supplied with the output voltage from the power supply device.

8. The electronic apparatus according to claim 7, wherein the output discharge unit is further configured to continue, even when the enable signal including the instruction to enable the power supply unit is received, the discharge of the output voltage until the output voltage falls below an under voltage locked out detection voltage lowest value set to each load.

* * * * *